(12) United States Patent  
Poorman (10) Patent No.: US 6,471,415 B1  
(45) Date of Patent: Oct. 29, 2002

(54) MULTICONDUCTOR INTERCONNECT

(75) Inventor: Paul W. Poorman, Meridian, ID (US)

(73) Assignee: Hewlett-Packard Company, Palo Alto, CA (US)

( * ) Notice: Subject to any disclaimer, the term of this patent is extended or adjusted under 35 U.S.C. 154(b) by 25 days.

(21) Appl. No.: 09/618,207

(22) Filed: Jul. 18, 2000

(51) Int. Cl.⁷ .............................................. G02B 6/38
(52) U.S. Cl. .......................................... 385/59; 439/67
(58) Field of Search .............................. 385/59; 439/67, 439/77

(56) References Cited

U.S. PATENT DOCUMENTS

| | | | |
|---|---|---|---|
| 3,214,725 A | | 10/1965 | Derose et al. |
| 3,633,189 A | | 1/1972 | Billawala ................. 340/174.1 |
| 4,682,828 A | * | 7/1987 | Piper et al. ................... 439/92 |
| 4,815,990 A | * | 3/1989 | Ristedt et al. .............. 439/496 |
| 5,042,971 A | | 8/1991 | Ambrose ..................... 439/77 |
| 5,061,830 A | | 10/1991 | Ambrose ......................... 200/5 |
| 5,130,499 A | | 7/1992 | Dijkshoorn ................. 174/254 |
| 5,160,276 A | | 11/1992 | Marsh et al. .............. 439/502 |
| 5,219,292 A | * | 6/1993 | Dickirson et al. ............ 439/67 |
| 5,697,794 A | * | 12/1997 | Mosquera .................... 439/67 |

* cited by examiner

Primary Examiner—Brian Sircus  
Assistant Examiner—Brian S. Webb (57) ABSTRACT

A space saving interconnect having a plurality of conductors. To decrease the width of a selected portion of the interconnect, the conductors are split between two or more layers. One group the conductors extend along a portion of a first layer jumping to and continuing along a second layer. The remaining conductors extend only along the first layer. Consequently, the width of the interconnect where the conductors are split between the layers can be substantially reduced. In one exemplary embodiment, the first layer is characterized by a first section having only first conductors and a second section having both the first second conductors. The first conductors in the first section of the first layer span a first width and the first and second conductors in the second section of the first layer span a second width greater than the first width. The second layer includes third conductors extending between first and second sections of the second layer. The third conductors in the first section of the second layer span a third width, and the third conductors in the second section of the second layer span a fourth width.

22 Claims, 11 Drawing Sheets

MULTICONDUCTOR INTERCONNECT

FIELD OF THE INVENTION

This invention generally relates to a multiconductor interconnect. More particularly, this invention relates to a space saving multiconductor interconnect for coupling two or more components of a particular device.

BACKGROUND OF THE INVENTION

With increased computerization, more and more sensitive and valuable information is being generated and stored. Consequently, the need for high capacity and cost effective data storage is ever increasing. Dual and single reel tape drives have become a preferred method for storing electronic data.

Figure 1:
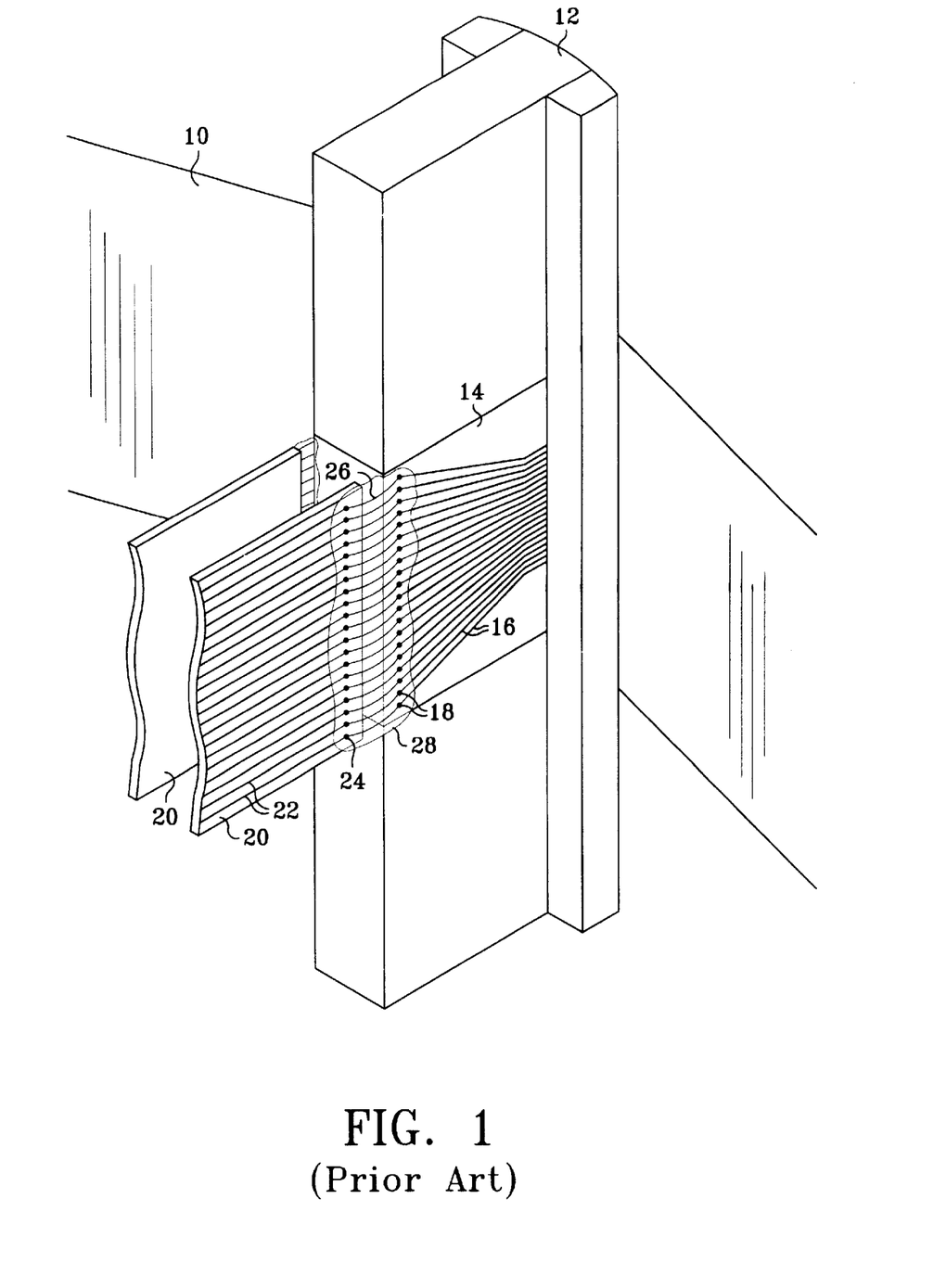
FIG. 1 is a perspective view of a transducer head with fanned out traces wire bound to conventional ribbon cables.

Referring to FIG. 1, using linear recording technology, a tape drive pulls tape 10 across a transducer head 12 saving and/or retrieving electronic data in multiple parallel tracks that extend along the length of tape 10. Increasing the number of tracks on tape 10 and decreasing the space between each track increases the tape's storage capacity. However, this also increases the complexity of head 12. Head 12 includes a number of read/write elements (not shown) formed on a thin film wafer 14. To align the read/write elements with a particular track on tape 10, head 12 may also include servo elements which read and possibly write alignment and position information on tape 10. The servo information can be used to accurately position head 12 both across the width of tape 10 on a desired track and along the length of tape 10 at the start of a specified file.

To enable a drive to read and write data while reading and recording alignment information, a number of traces 16 and corresponding bond pads 18 are required to connect head 12 to the other components of the tape drive. For example, an eight track head requires eighty or more traces. Additional traces for shield connections, ground lines, and connections on thin film wafer 14 can raise that total to ninety or more.

Typically, one or more ribbon cables 20 are used to connect head 12 to the other components of a tape drive. Ribbon cable 20 consists of a series of conductors 22 on a flat flexible strip of insulative material. Conductors 22, generally parallel to one another, extend along the length of the strip terminating at each end of the strip with bond pads 24 or some other suitable termination points. On one end of the strip, as shown in FIG. 1, each bond pad 24 on the ribbon cable is coupled to a corresponding bond pad 18 on thin film wafer 14 of head 12 with bond wires 26 using thermocompression, thermosonic, or ultrasonic wire bonding techniques. Bond pads 18 and 24 and bond wires 26 are then encapsulated in epoxy 28 or some other suitable encapsulating material.

Current technology allows placement of approximately 45 conductors on a 7 millimeter wide ribbon cable. However, the same number of traces require only a 3 millimeter width on thin film wafer 14. Referring still to FIG. 1, one known solution for aligning bond pads 24 on ribbon 20 with the bond pads 18 on thin film wafer 14 involves fanning out traces 16. This solution increases the size of thin film wafer 14 and, consequently, the manufacturing cost of transducer head 12.

Figure 2:
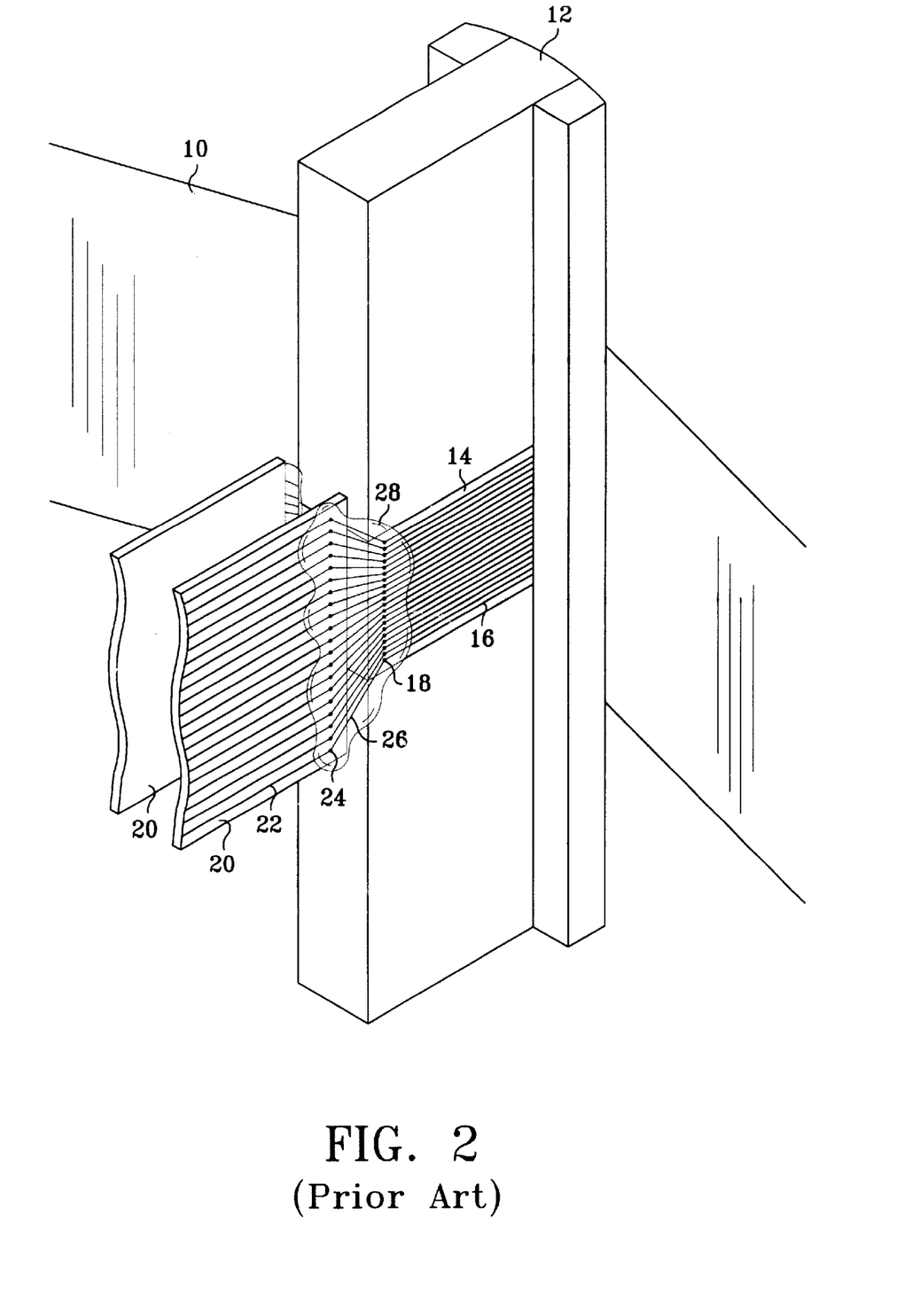
FIG. 2 is a perspective view of a transducer head connected to conventional ribbon cables with fanned out wire bonds.

Referring now to FIG. 2, instead of fanning out the traces on transducer head 12, a second known solution involves fanning out bond wires 26 that connect ribbon cable 20 to head 12. However, the increased length in the outer bond wires causes a number of problems. First, the longer wires are more likely to contact adjacent wires and cause a short circuit. It is difficult to adapt a wire bond tool to the changing angles of bond wires 26, and the longer outer wires are more likely to snag on the tooling and break before encapsulation. And, the additional length of the outer bond wires 26 increases the resistance and inductance of the connection between head 12 and the other components of a tape drive.

Figure 3A:
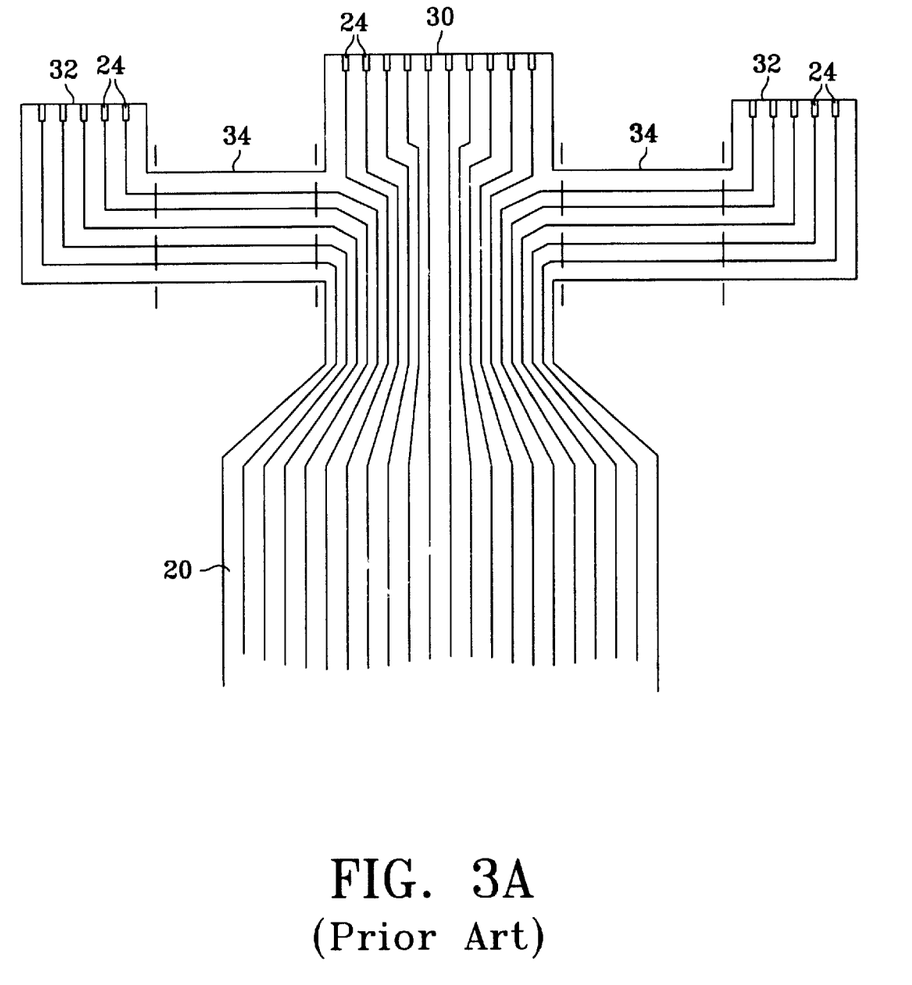
FIGS. 3A is a plan view of the ribbon cable disclosed in the Billawala patent.
Figure 3B:
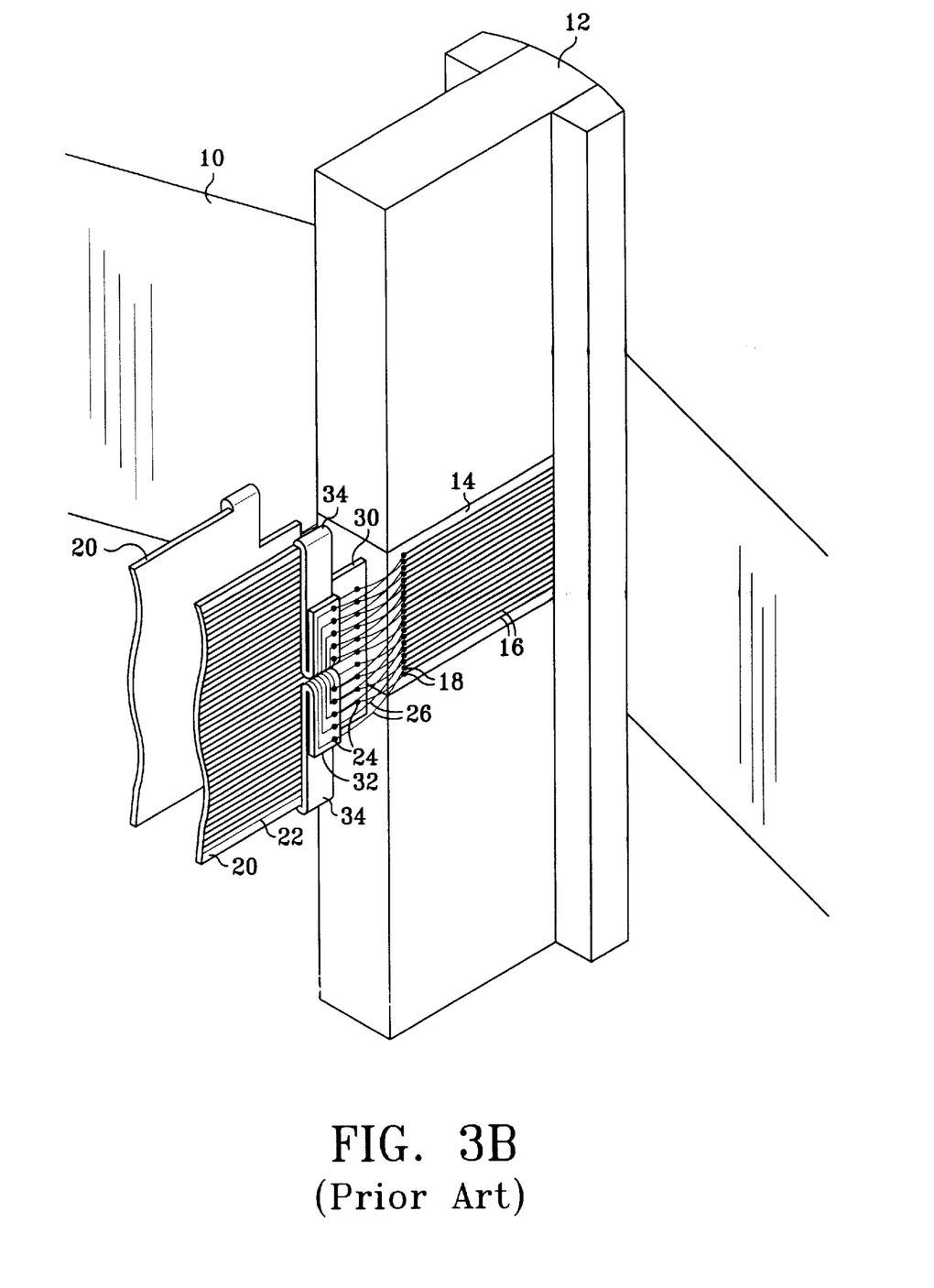
FIG. 3B is a perspective view of another version of the ribbon cable from FIG. 3A attached to a transducer head.

Referring now to FIG. 3A, a third known solution is revealed in U.S. Pat. No. 3,633,189 which issued to Shahbuddin Billawala in 1972. Billawala discloses a ribbon cable 20 capable of concentrating bond pads 24 into a small area. Ribbon cable 20 terminates on one end with a central portion 30 and two lateral portions 32. Transverse portions 34 connect each lateral portion 32 to the central portion 30. One half of ribbon cable's conductors terminate with bond pads 24 on central portion 30 while one quarter of the conductors terminate with bond pads 24 on each lateral portion 32. FIG. 3B shows a slightly modified version of Billawala's cable. Each transverse portion 34 is folded over itself placing the lateral portions 32 in a plane parallel to that of central portion 30. This places bond pads 24 in two parallel rows—the first row defined on central portion 30 and the second row defined on lateral portions 32.

While Billawala allows ribbon cable 20 to be wire bonded to head 12 without fanning bond wires 26 or traces 16 on head 12, the design creates a number of problems. First, the unsupported folded transverse portions 34 increase the thickness of ribbon cable 20. The increased length of the conductors passing through transverse portions 34 increases the cable's resistance and inductance. If each conductor has different electrical characteristics, balancing the tape drive's amplifiers for the read elements and drivers for the write elements becomes more difficult. The loops in the conductors created by folding transverse portions 34 increase the cable's susceptibility to magnetic interference. The double folds also increase the risk of broken conductors. Finally, wire bonding requires accurate placement of all bond pads 18 and 24, and Billawala fails to disclose a method for reliably aligning bond pads 28 on the lateral portions 32 with those on central portion 30 after lateral sections 34 are folded.

SUMMARY OF THE INVENTION

The present invention is directed to a space saving multiconductor interconnect. A plurality of conductors extend through the interconnect. To decrease the width of a selected portion of the interconnect, the conductors are split between two layers. One group the conductors extend along a portion of a first layer jumping to and continuing along a second layer. The remaining conductors extend only along the first layer. Consequently, the width of the interconnect where the conductors are split between the layers can be substantially reduced.

In one exemplary embodiment, the first layer is characterized by a first section having only first conductors and a second section having both the first second conductors. The first conductors in the first section of the first layer span a first width and the first and second conductors in the second section of the first layer span a second width greater than the first width. The second layer includes third conductors extending between first and second sections of the second layer. The third conductors in the first section of the second layer span a third width, and the third conductors in the second section of the second layer span a fourth width.

DETAILED DESCRIPTION OF THE INVENTION

An essential component of a tape drive, the transducer head, includes a plurality of read/write elements formed within a thin film wafer. The read/write elements include magnetic pole tips positioned on the head's tape bearing surface. A series of conductors or traces, also formed on the wafer, couple the read/write elements to a set of bond pads. The present invention is directed to a multiconductor interconnect for coupling those bond pads to the other components of the tape drive. It is important to note, however, that while it is envisioned that the present invention will be used in a tape drive, the invented interconnect may be used in other applications where it is beneficial to limit the width of one or both ends of a ribbon cable or other multiconductor without decreasing the number of conductors or substantially limiting the flexibility of the interconnect.

Figure 4A:
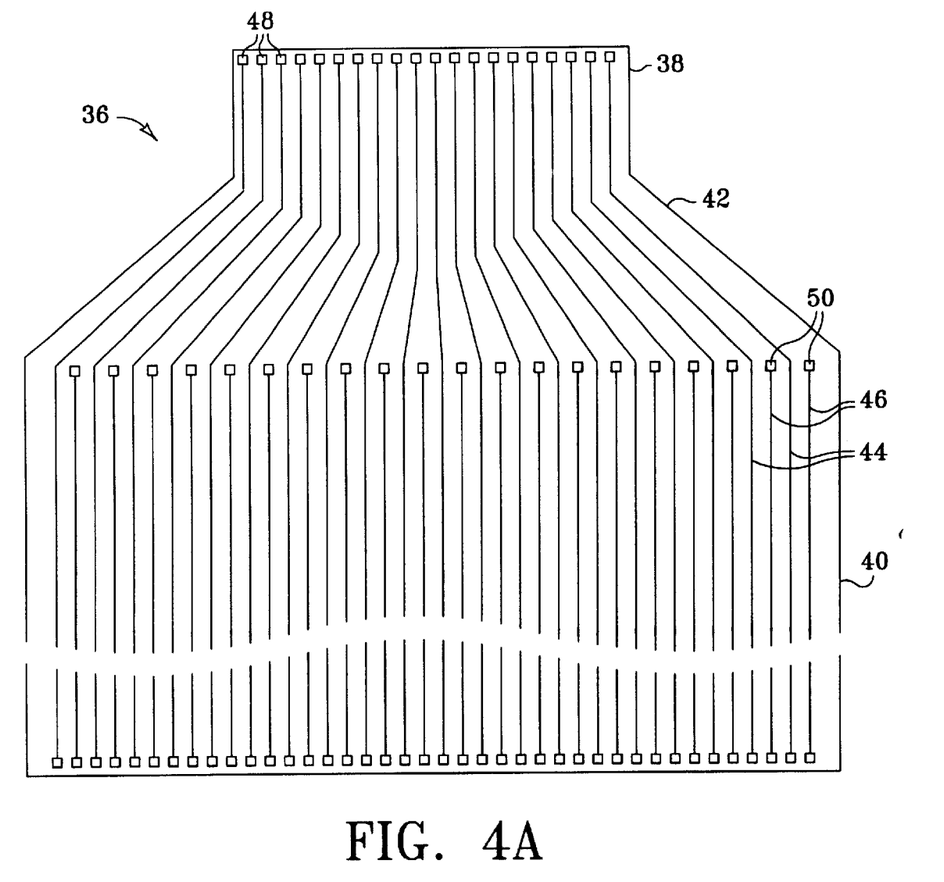
FIGS. 4A illustrates a first layer according to one embodiment of the present invention.
Figure 4B:
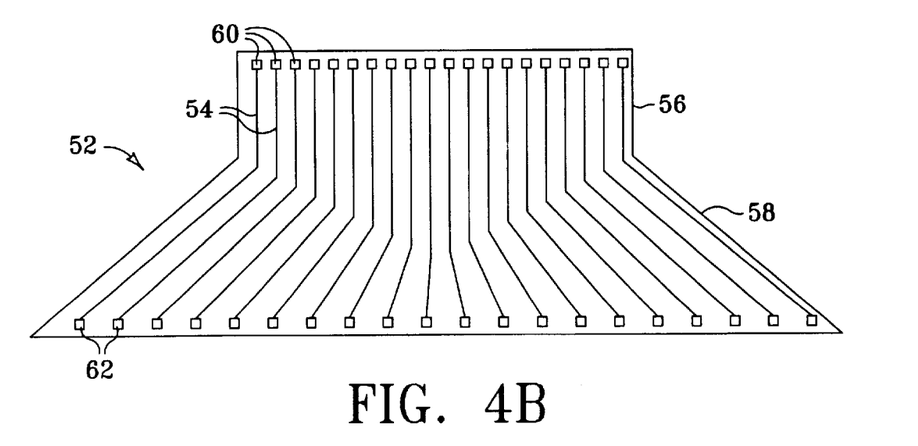
FIG. 4B illustrates a second layer according to one embodiment of the present invention.

One embodiment of the invented interconnect will be described with reference to FIGS. 4A–4C. FIGS. 4A and 4B each show a component of the interconnect which are combined in FIG. 4C. FIG. 4A illustrates a first layer 36 which is defined, at least in part, by a narrow first section 38, wide second section 40, and transition section 42 between first section 38 and second section 40. Typically, first layer 36 will be a flexible strip of insulative material encasing first and second conductors 44 and 46. First conductors 44 extend along a length of first layer 36 through second section 40, constricting through transition section 42, and each terminating at one connection point 48 within first section 38. Second conductors 46 extend along the length of first layer 36 through second section 40 each terminating with one intermediate connection point 50 in second section 40 near the boundary between second section 40 and transition section 42.

As shown, except for those immediately adjacent to an edge of first layer 36, first conductors 44 are each interspaced between second conductors 46 with the number of first and second conductors being equal. This need not always be the case. The first and second conductors 44, 46 may be arranged into other desirable patterns. Moreover, first section 38 need not be centrally located across the width of first layer 36 as shown, but, depending upon the application, may be skewed to either side.

FIG. 4B illustrates second layer 52 formed from a flexible strip of insulative material encasing third conductors 54. Second layer 52 includes a narrow first section 56 and a wide second section 58 with connection points 60 and 62 placed across sections 56 and 58.

The terms wide and narrow are used only to establish the relative widths of first sections 38, 56 and second sections 40, 58. First and second layers 36, 52 may be of most any desired shape, so the term section is used to describe the portions of layers 36, 52 that contain conductors 44, 46, and 54.

Consequently, the width of second section 40 equals the width of that portion of first layer 36 required to accommodate first and second conductors 44, 46, in other words, the width spanned by first and second conductors 44, 46. The smaller width of first section 38 is determined by the width required to accommodate only first conductors 44.

Figure 4C:
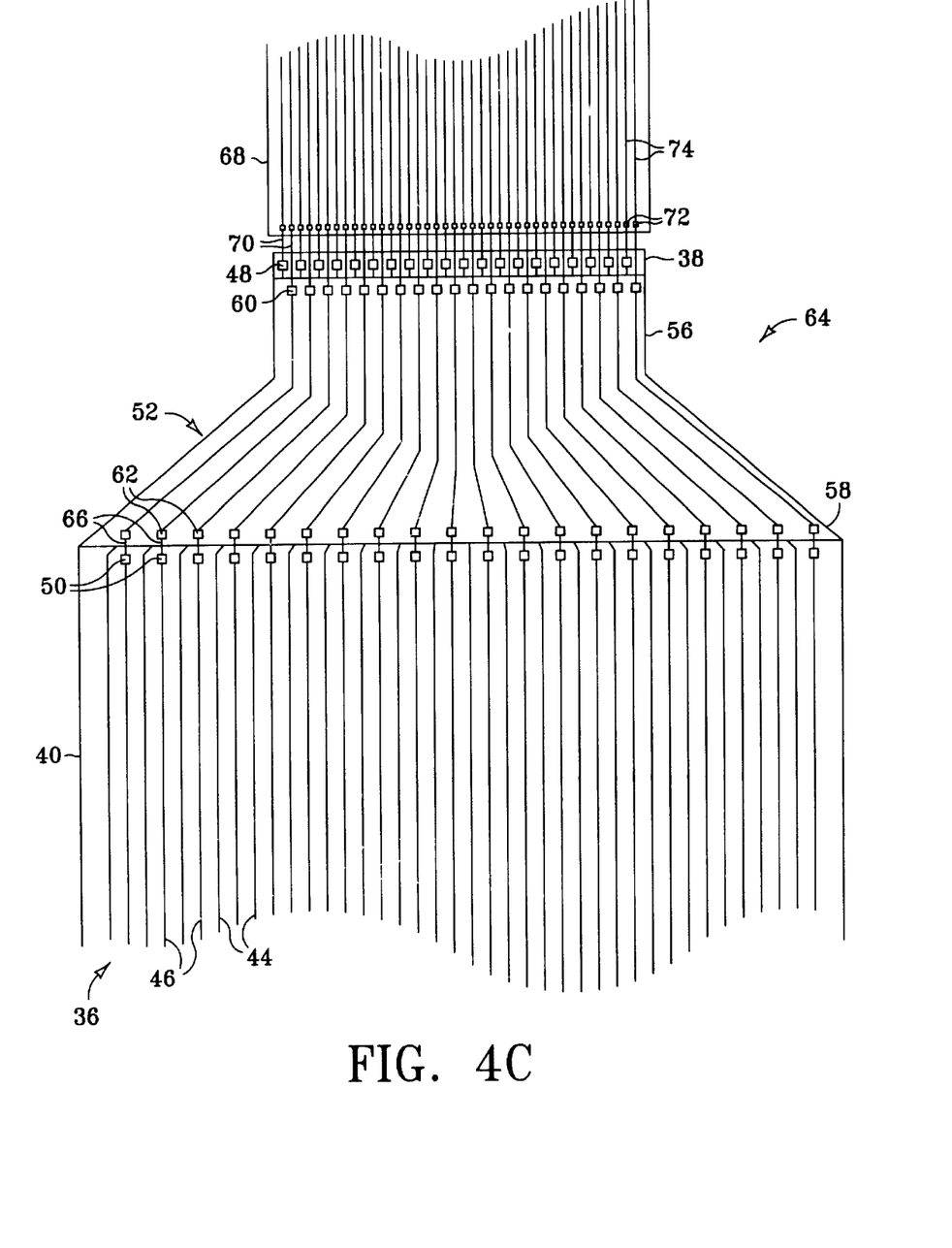
FIG. 4C illustrates one embodiment of the invented multiconductor interconnect showing the second layer of FIG. 4B connected to the first layer of FIG. 4A.

Incorporating the elements from FIGS. 4A and 4B, FIG. 4C illustrates one embodiment of the invented multiconductor interconnect, generally referenced as 64. Second layer 52 overlaps the first layer 36 with first sections 38 and 56 being parallel to but slightly offset from one another, leaving connection points 48, 50, 60 and 62 accessible. Second section 58 of second layer 52 is adjacent to the boundary between second section 40 and transition section 42 on first layer 36. A fourth set of conductors 66 each couple an intermediate connection point 50 within second section 40 on first layer 36 to a connection point 62 within second section 58 of second layer 52. It is envisioned that first layer 36 and second layer 52 will be laminated to one another or otherwise affixed using a conventional adhesive. FIG. 4C also shows multiconductor interconnect 64 connected to another component 68 such as a transducer head on a tape drive. A fifth set of conductors 70 each couple a connection point 48 on first section 38 of first layer 36 or a connection point 60 on first section 56 of second layer 52 to a connection point 72 on component 68.

Figure 5A:
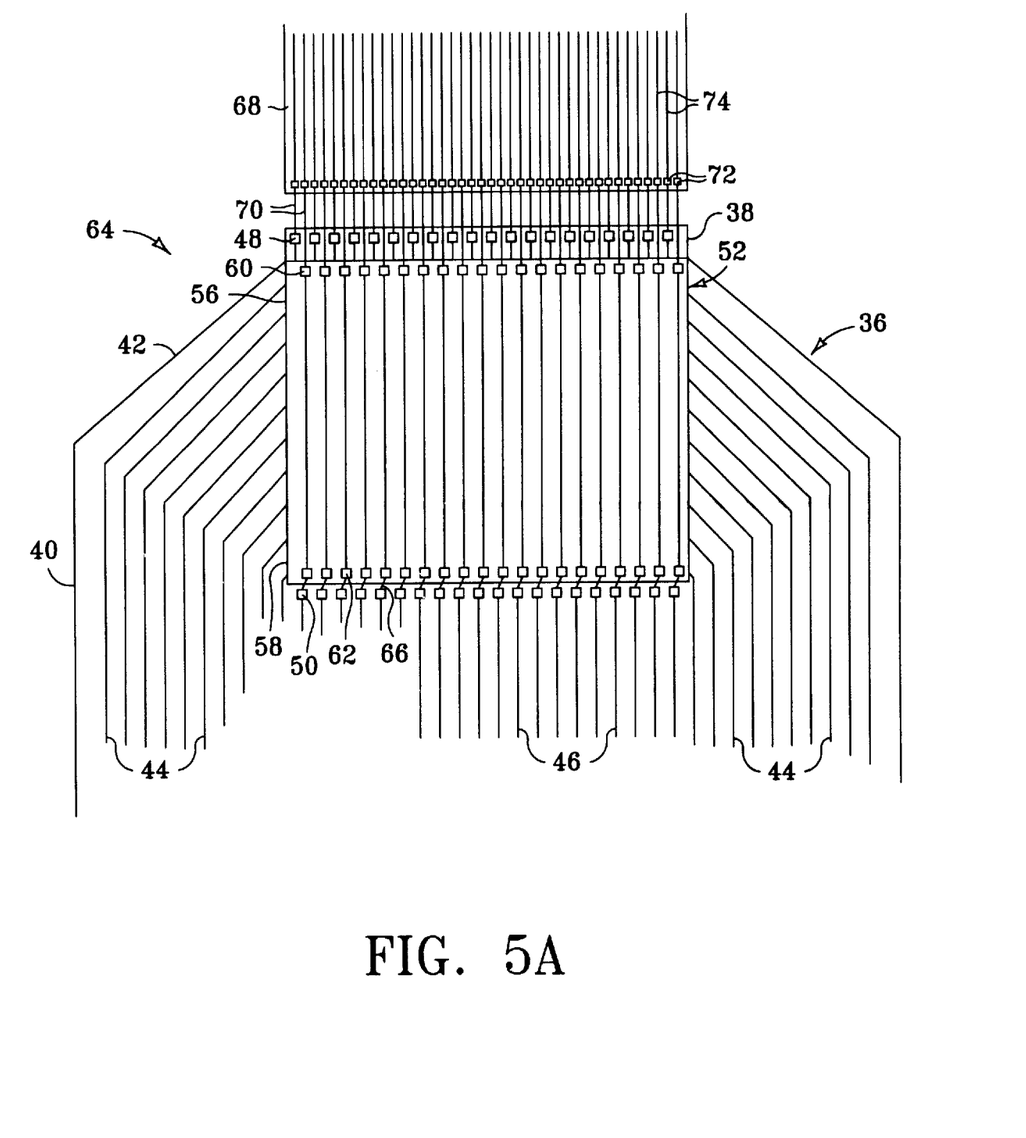
FIGS. 5A–5C illustrate further configurations of the invented multiconductor interconnect.
Figure 5B:
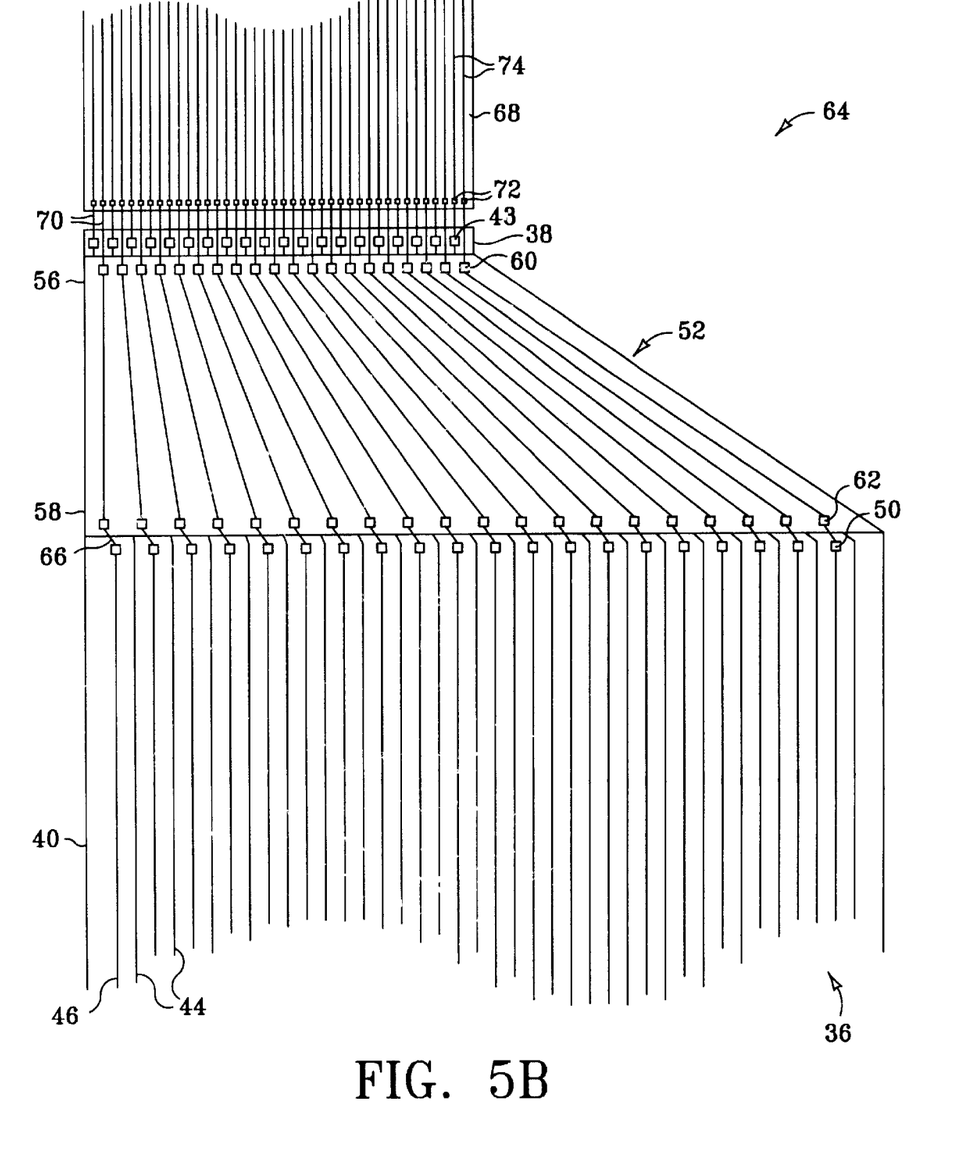
Figure 5C:
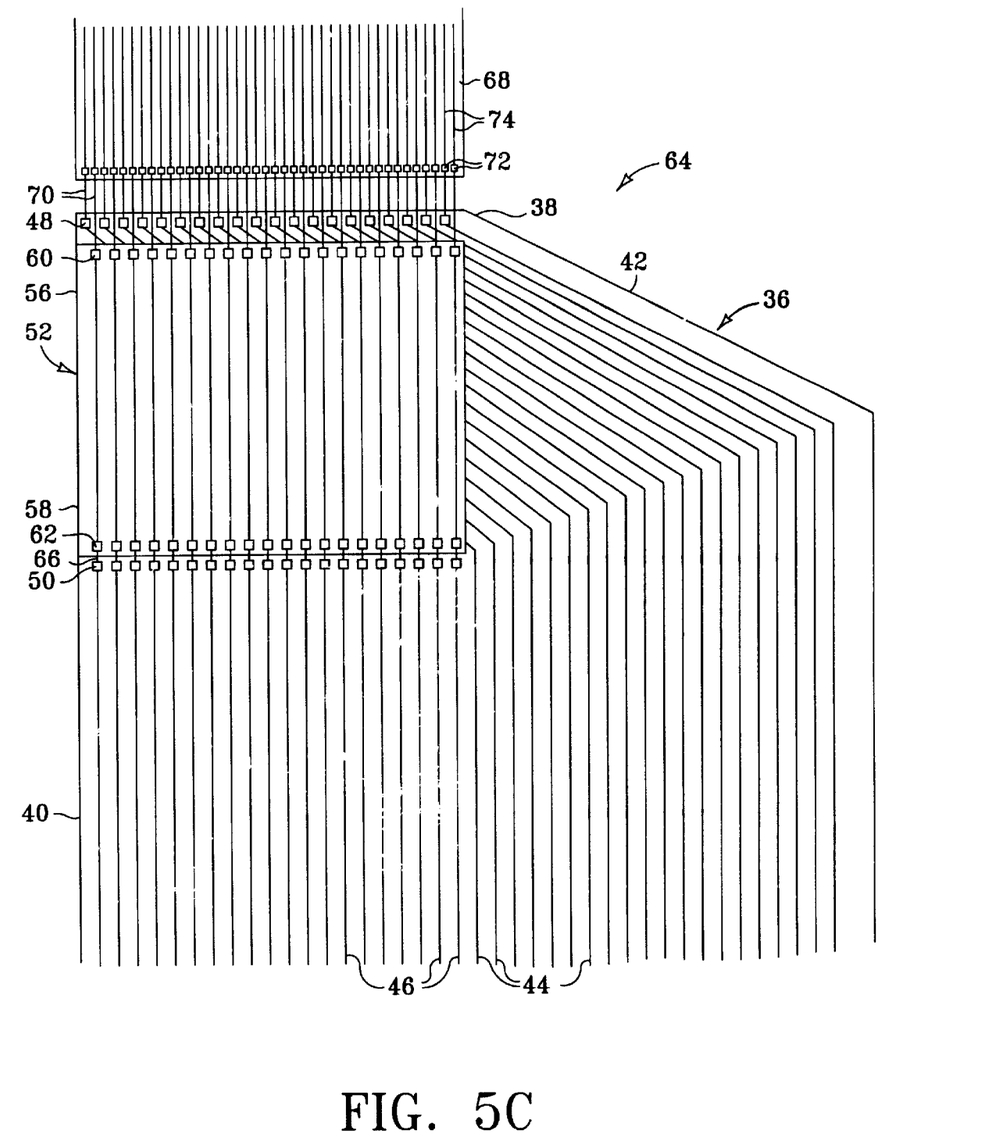

In the embodiment shown in FIG. 4C, the width of second section 40 of first layer 36 is about twice that of first section 38. The width of first section 56 of second layer 52 is about the same as that of first section 38 on first layer 36. The width of second section 58 of second layer 52 is about the same as second section 40 of first layer 36. However, second section 58 of second layer 52 need not be wider than first section 56. Referring to FIG. 5A, If sections 58 and 56 are the same width, second conductors 46 might be centrally located on first layer 36 terminating with intermediate connection points 50 within second section 40 located adjacent to connection points 62 on second layer 52. First conductors 44 would then be located on either side of second conductors 46. Other configurations are possible. For example, In FIG. 5B, first sections 38, 56 of layers 36, 52 are skewed to one side of multiconductor assembly 64. In the configuration of FIG. 5C, first section 38 of first layer 36 is skewed to one side of multiconductor assembly 64. First section 56 of second layer 52 is located adjacent to first section 38 of first layer 36 while sections 56 and 58 of second layer 52 have equal widths. Second conductors, within second section 40 of first layer 38, are located on one half of first layer 36 while first conductors 44 extend from the other half, bending through transition section 42, and terminating in first section 38.

Connection points 48, 50, 60 and 62 on first layer 36 and second layer 52 may be bond pads exposing the ends of each conductor. Connection points may also be through holes, posts, or anything else suitable for enabling a circuit to be completed between first layer 36, second layer 52, and component 68. While it is envisioned that the conductors will be electrical conductors, they may instead be optical conductors or a combination of both.

Figure 6:
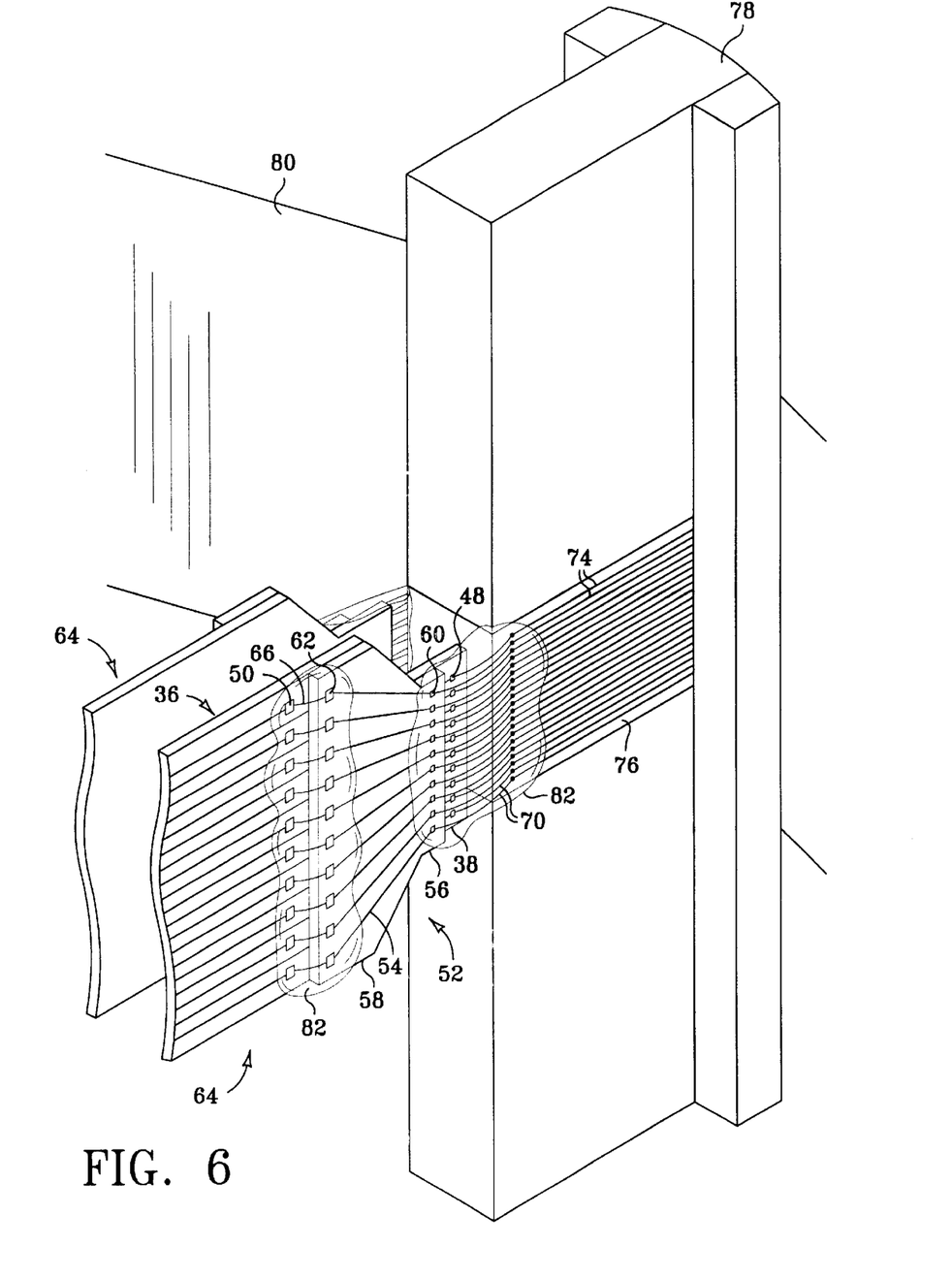
FIG. 6 is a perspective view of one embodiment of the invented multiconductor interconnect connected to a transducer head.

FIG. 6 illustrates a pair of multiconductor interconnects 64 from FIG. 4C coupled to conductive traces 74 on thin film wafer of transducer head 78. Tape 80 stretches over thin film wafer 76, and encapsulating material 82 protects conductors 66 and 70. Because connection points 48, 60 within the first sections 38, 56 of layers 36, 52 can be packed into a width equal to that of thin film wafer 76, neither traces 74 nor conductors 70 need to be fanned out and the lengths of conductors 70 can remain generally uniform.

Figure 7:
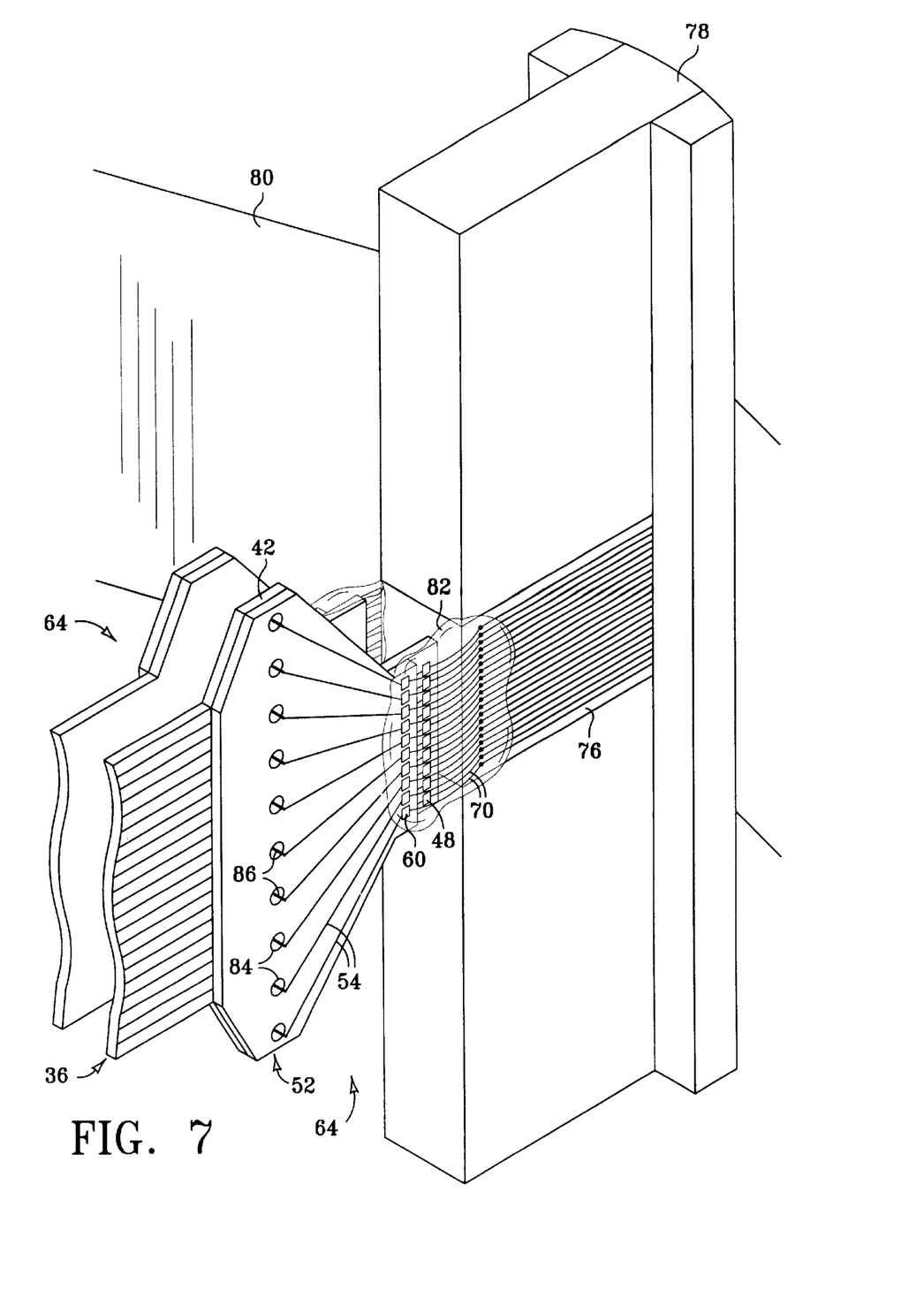
FIG. 7 is a perspective view of a second embodiment of the invented multiconductor interconnect connected to a transducer head.

In a second embodiment of interconnect 64 illustrated in FIG. 7, the connection points within second section 58 of second layer 52 are through holes 84 while the fourth conductors 66 or intermediate connection points 50 (not shown) are conductive inserts 86. Conductive inserts 86 may be formed through a conventional chemical deposition process, through soldering, or they may be conductive posts. This manner of connection could be reversed with through holes 84 being placed on first layer 36, or through holes 84 could be drilled through both the first layer 36 and second layer 52. However accomplished, through holes 84 and conductive inserts 86 create a reliable connection without the use of bond wires and encapsulants.

The present invention has been shown and described with reference to the foregoing exemplary embodiments. It is to be understood, however, that other forms, details, and embodiments may be made without departing from the spirit and scope of the invention as defined in the following claims. For example, second layer 52 and first layer 36, particularly transition section 42 and first section 38 of first layer 36, might be constructed from rigid material where necessary or desirable.

What is claimed is:

1. A multiconductor interconnection kit, comprising:
   a first layer comprising first conductors and second conductors, the first layer characterized by a first section having only the first conductors and a second section having both the first and second conductors, the first conductors in the first section of the first layer spanning a first width and the first and second conductors in the second section of the first layer spanning a second width greater than the first width; and
   a second layer comprising third conductors extending between first and second sections of the second layer, the third conductors in the first section of the second layer spanning a third width and the third conductors in the second section of the second layer spanning a fourth width greater than the third width.

2. The kit of claim 1, wherein second conductors in the second section of the first layer are conductively joined to third conductors in the second section of the second layer.

3. The kit of claim 1, further comprising the first conductors each having a connection point in the first section of the first layer, the second conductors each having a connection point in the second section of the first layer, and the third conductors each having connections points in the first and second sections of the second layer.

4. The kit of claim 3, wherein second conductors are conductively joined to third conductors through their respective connection points.

5. The kit of claim 1, wherein the second layer is affixed to the first layer.

6. The kit of claim 1, wherein the first width is substantially equal to the third width.

7. The kit of claim 6, wherein the second width is substantially equal to the fourth width and is at least twice as great as the first width.

8. A multiconductor interconnect, comprising:
   a first layer having first and second sections;
   a second layer having first and second sections, the first section of the second layer located adjacent to the first section of the first layer and the second section of the second layer located adjacent to the second section of the first layer;
   first conductors extending between the first and second sections of the first layer each having a connection point in the first section of the first layer;
   second conductors in the second section of the first layer each having a connection point in the second section of the first layer;
   third conductors in the second layer each having connection points in the first and second sections of the second layer; and
   second conductors in the second section of the first layer conductively joined to third conductors in the second section of the second layer through their respective connection points.

9. The multiconductor interconnect of claim 8, wherein the first conductors in the first section of the first layer span a first width and the first and second conductors in the second section of the first layer span a second width greater than the first width.

10. The multiconductor interconnect of claim 9, wherein the second width is at least twice as great as the first width.

11. The multiconductor interconnect of claim 9, wherein the third conductors in the first section of the second layer span a width that is substantially equal to the first width, and the third conductors in the second section of the second layer span a width that is substantially equal to the second width.

12. The multiconductor interconnect of claim 11, wherein each of the first conductors is located immediately adjacent to at least one of the second conductors.

13. The multiconductor interconnect of claim 8, wherein the connection points in the second section of the first layer are through holes and further comprising conductive inserts each extending through one hole to conductively join a second conductor and a third conductor.

14. The multiconductor interconnect of claim 8, wherein the connection points in the second section of the second layer are through holes and further comprising conductive inserts each extending through one hole to conductively join a second conductor and a third conductor.

15. The multiconductor interconnect of claim 8, wherein each of the conductors is an electrical conductor.

16. The multiconductor interconnect of claim 8, wherein each of the conductors is an optical conductor.

17. The multiconductor interconnect of claim 8, wherein each of the connection points is a bond pad, and the conductors are joined with bond wires extending between connection points.

18. A transducer head multiconductor interconnect, comprising:
   a transducer head having a media bearing surface with one or more read/write elements disposed thereon and a plurality of conductive traces coupling the read/write elements to a plurality of connection points;
   a first multiconductor layer having first and second sections;
   a second multiconductor layer having a first and second sections, the first section of the second layer located adjacent to the first section of the first layer and the second section of the second layer located adjacent to the second section of the first layer;

first conductors extending between the first and second sections of the first layer each having a connection point in the first section of the first layer;

second conductors in the second section of the first layer each having a connection point in the second section of the first layer;

third conductors in the second layer each having connection points in the first and second sections of the second layer;

fourth conductors each coupling one connection point in the second section of the first layer to one connection point in the second section of the second layer; and fifth conductors each coupling one connection point in the first section of the first layer or one connection point in the first section of the second layer to one connection point on the transducer head.

19. The apparatus of claim 18, wherein the transducer head includes a thin film wafer on which the head's read/write elements, conductive traces, and connection points are formed, the connection points being arranged in a compact row that spans a first width.

20. The apparatus of claim 19, wherein the first conductors in the first section of the first layer span a width that is substantially equal to the first width, and the first and second conductors in the second section of the first layer span a second width that is greater than the first width.

21. The apparatus of claim 20, wherein the third conductors in the first section of the second layer span a width that is substantially equal to the first width, and the third conductors in the second section of the second layer span a width that is substantially equal to the second width.

22. The apparatus of claim 21, wherein the second width is at least twice as great as the first width.

* * * * *